United States Patent [19]

Jans

[11] Patent Number: 4,811,014

[45] Date of Patent: Mar. 7, 1989

[54] CIRCUIT ARRANGEMENT FOR TELECOMMUNICATIONS SYSTEMS, PARTICULARLY TELEPHONE SWITCHING SYSTEMS, COMPRISING INFORMATION INTERROGATING DEVICES CYCLICALLY DRIVING INQUIRY LOCATIONS

[75] Inventor: Herbert Jans, Neuried, Fed. Rep. of Germany

[73] Assignee: Siemens Aktiengesellschaft, Berlin and Munich, Fed. Rep. of Germany

[21] Appl. No.: 890,117

[22] Filed: Jul. 28, 1986

[30] Foreign Application Priority Data

Aug. 14, 1985 [DE] Fed. Rep. of Germany ....... 3529172

[51] Int. Cl.$^4$ ............................................. H04Q 3/24
[52] U.S. Cl. ............................ 340/825.100; 379/384
[58] Field of Search ........... 340/825.1, 825.12, 825.13; 379/384, 92; 178/2 C

[56] References Cited

U.S. PATENT DOCUMENTS

| 3,868,482 | 2/1975 | Colas | 379/384 |
| 4,071,908 | 1/1978 | Brophy et al. | 379/92 |
| 4,287,567 | 9/1981 | Lumsden | 379/92 |

FOREIGN PATENT DOCUMENTS

| 0032848 | 4/1981 | Japan | 340/825.13 |
| 0005454 | 1/1982 | Japan | 340/825.1 |

OTHER PUBLICATIONS

DE2748795A1, Apr. 1979, J. Rohrig, Germany.
DE3443616A1, Apr. 1986, W. Zilbauer, Germany.
Publication Entitled "Telcom Report", vol. 4, 1981, Special Issue EWSD Digital Switching System, pp. 3–67.

Primary Examiner—Donald J. Yusko
Attorney, Agent, or Firm—Hill, Van Santen, Steadman & Simpson

[57] ABSTRACT

An interrogating device cyclically calling in information from various inquiry locations selects the various inquiry locations a different number of times, for which purpose addresses of the inquiry location are stored a different number of times in an interrogation control memory. When an interrogating device is not supplied with any information when an inquiry location is interrogated, the inquiry location is skipped the next time. To this end, when no information is received given selection of an inquiry location with its address, that memory location where the same address is again stored is first sought in the memory and a note bit is stored there. The memory location immediately following the previously-selected memory location is then sought in the memory and the appertaining, next inquiry location is selection with the address read. The note bit effects that the inquiry location which is interrogatable with the appertaining address is not interrogated once; the note bit is then erased.

4 Claims, 1 Drawing Sheet

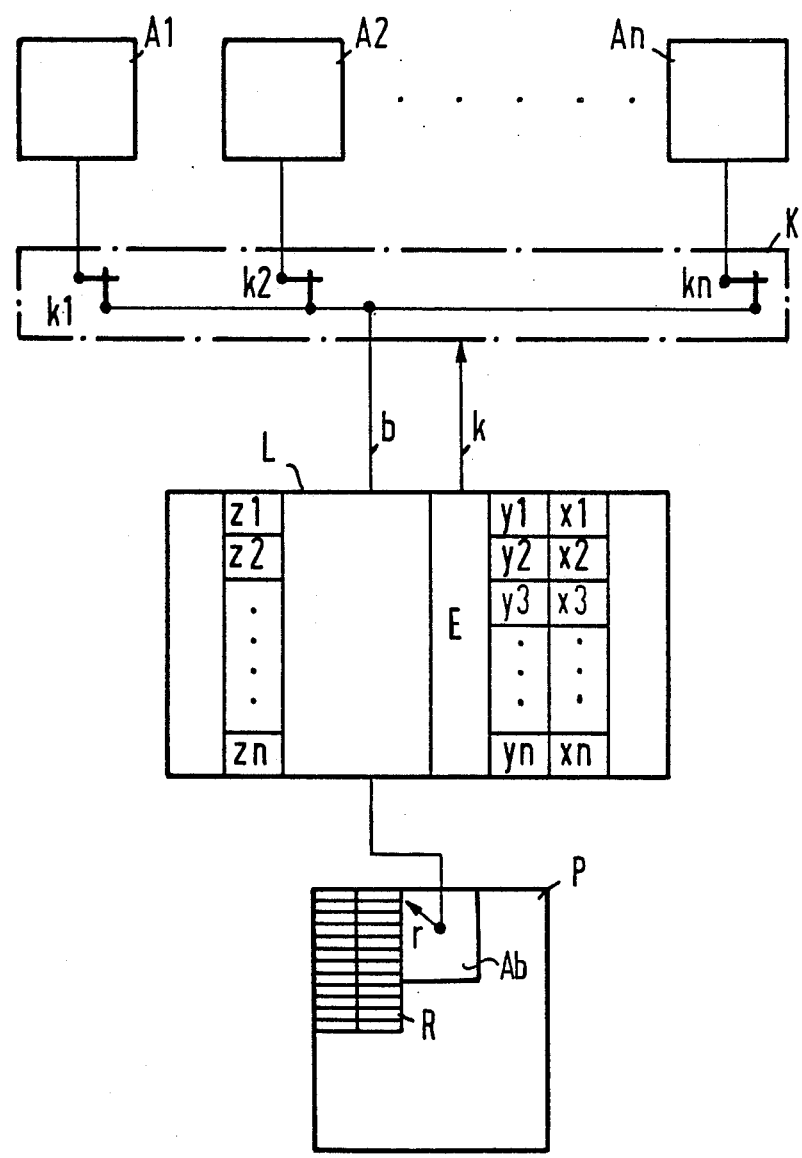

CIRCUIT ARRANGEMENT FOR TELECOMMUNICATIONS SYSTEMS, PARTICULARLY TELEPHONE SWITCHING SYSTEMS, COMPRISING INFORMATION INTERROGATING DEVICES CYCLICALLY DRIVING INQUIRY LOCATIONS

CROSS REFERENCE TO RELATED APPLICATION

This application is related to an application Ser. No. 890,114, filed July 28, 1986, now U.S. Pat. No. 4,785,298.

BACKGROUND OF THE INVENTION

1. Field of the Invention

The present invention relates to a circuit arrangement for telecommunications systems and is particularly concerned with telephone switching systems which comprise information interrogating devices cyclically driving a plurality of inquiry locations. The information interrogating devices solicit information which may be present with different interrogation frequencies with respect to the various inquiry locations and modify the interrogation frequency with respect to a respective inquiry location depending on the appearance of an information to be called in. Interrogation memories assigned to the information interrogating devices in which the individual plurality of selection events within an overall control cycle respectively covering all inquiry locations are individually stored for each of the inquiry locations, whereby the individual plurality of selection events is stored in the interrogation memory for each of the inquiry locations by way of a corresponding one-time or repeated storing of their respective addresses at a corresponding number of memory locations which are distributed within the cycle sequence of the totality of the memory locations being particularly regularly distributed and being successively cyclically read.

2. Description of the Prior Art

A circuit arrangement of this type is disclosed in the German published application No. 3,443,616 and enables inquiry locations to be interrogated with differing frequency. Inquiry locations can be individual scan points, for example in subscriber-associated switching devices such as connector sets or subscriber line circuits. This is set forth in greater detail in, for example, the German published application 2,748,795 which, with the aforementioned German published application is fully incorporated herein by this reference. Incoming switch identifiers are recognized in that different interrogation results are acquired in the interrogation events undertaken at a scan point proceeding from a certain time than are acquired before that time, namely for the duration of the switch identifier. In this context, the latter-mentioned application discloses that, for example, selection pulses output from subscriber stations arrive in connector sets. The scan points are normally scanned at a relatively slow tempo. When the beginning of the selection pulse is recognized by way of an interrogation event, then the relatively slow interrogation tempo is replaced by a relatively fast interrogation tempo. In an arrangement as disclosed in this published application, the possibility is provided of chronologically acquiring the end of a respective selection pulse as accurately as possible and, therefore, the duration of the appertaining dial pulse. In this manner, for example, selection pulses and switch identifiers formed by these pulses having a different duration can be distinguished from one another with great reliability.

When an interrogation result indicating a pulse beginning is identified in this latter known instance, then the interrogation tempo having a relatively low sequence changes to one having a relatively fast sequence. When, in the second interrogation event (or in the third interrogation event), a further interrogation result of the same content is identified after an interrogation result indicating a pulse beginning, then it is perceived that it was, in fact, not a matter of a pulse beginning, but a matter of a disturbance. In response thereto, the interrogation rhythm for the further interrogation events is changed back from the relatively fast sequence to the relatively slow sequence.

As is known from the mentioned German published application No. 2,748,795, the change of the interrogation tempo serves the purpose of increasing the interrogation capacity of an interrogating device by slowing the interrogation tempo in that the number of inquiry locations can be likewise increased to a corresponding degree, whereby a chronologically relatively exact acquisition of switch identifiers having a specific and individual duration is nonetheless guaranteed. When, however, it is not a matter of cyclical scanning of scan points for the acquisition of switch identifiers by distinguishing the switch identifier condition from the switch condition alternative thereto (for example pulse pause and "interselection time"), but is a matter of a call-in of complete information from individual inquiry locations, then a different problem arises. The volume of information to be called in can differ greatly at different inquiry locations. When the different inquiry locations are uniformly cyclically selected, then there can be inquiry locations where the information to be called in back up, whereas there are other inquiry locations at which information for call in are only sporadically present when they are selected and interrogated. In comparison to the principle of cyclic scanning, the principle is also known in this context of selecting inquiry locations on the basis of individually output request signals. What is disadvantageous, however, is the outlay which must be expended for generating, emitting, transmitting, accepting and evaluating these request signals, as well as the successive processing of the request signals. The invention therefore proceeds from the circuit arrangement of the type mentioned above wherein the various inquiry locations are cyclically selected.

It can occur in circuit arrangements of the type set forth above that the volume of information to be called in is not only unequal at the various locations, but is also subject to fluctuations, per inquiry location, and that a discontinuous change of the crush of information to be called in can occur at the individual inquiry locations. In order to counter this problem, the aforementioned German published application No. 3,443,616 has proposed a circuit arrangement in which it is provided that an information interrogating device executing successive interrogation cycles assigns cycle numbers to the inquiry locations and stores them for the assignment of interrogation frequencies for the inquiry locations. These cycle numbers indicate the respective number of interrogation cycles at which the appertaining inquiry location is selected each time. Accordingly, an inquiry location is interrogated only once in an interrogation cycle or in two or more interrogation cycles, in particular based on the measure of a respectively stored cycle number. It is also proposed in accordance with the circuit arrangement that the information interrogating device immediately selects an inquiry location in the next interrogation cycle each time an information from this inquiry location has been received and either repeats this given renewed receipt of an information and, in the opposite case, again continues the interrogation tempo from this point on based on the measure of the cycle numbers stored for this inquiry location. Accordingly, therefore, the interrogation tempo per inquiry location is boosted from an interrogation tempo individually assigned to the appertaining inquiry location to a uniform, maximum interrogation tempo. In addition, the mentioned proposed circuit arrangement provides that the information accepted from the various inquiry locations are counted in time intervals per inquiry location and the cycle numbers are again adapted after each time interval, being adapted inversely proportional based on the measure of these counter results, for example by the respective value "1". In accordance therewith, therefore, the cycle numbers stored for inquiry location are dynamically adapted based on the actual traffic volume.

In a circuit arrangement of this type, therefore, a great crush of information to be called in at an inquiry location effects that this is not interrogated based on the measure of the respectively stored cycle number, but is interrogated in every interrogation cycle. This means that the inquiry locations having the currently-heaviest volume of information to be interrogated are interrogated with equal frequency. A greater crush of information to be interrogated at all inquiry locations would result in the fact that all inquiry locations would be interrogated with identical frequency. As a result thereof, the effect produced by the cycle numbers stored per inquiry location, namely that the various inquiry locations are interrogated with different frequencies, would be completely leveled precisely in those times having a particularly heavy volume of information to be interrogated.

SUMMARY OF THE INVENTION

The object of the present invention is to provide that, in a circuit arrangement of the type set forth above, given unequal occurrence of information to be interrogated at the various inquiry locations as well as given fluctuations pertaining thereto and given discontinuous change of the crush of information to be interrogated at individual inquiry locations, the different interrogation frequencies provided are not simply evened out, whereby, however, the information interrogation devices should react to the volume of information to be interrogated in order to oppose a back up with respect to information to be interrogated at the inquiry locations.

In this context, a further object of the invention is to reduce the circuit-oriented expense as well as the circuit-oriented work expense for taking the fluctuating and, in part, discontinuously-changing volume of information to be interrogated into consideration in comparison to the proposed circuit arrangement mentioned above. The present invention should therefore particularly do justice to the fact that the number of individually-successively interrogatable information present for inquiry location is unresolved, that, therefore, a respective plurality of information can also be simultaneously ready to be called in per inquiry location and that, given particular consideration thereof, those means and events by way of which the interrogation events are adapted to the fluctuating and, in part, discontinuously-changing volume of information to be called in should be designed in a particularly simple manner. The expense for apparatus and work sequences to be executed should thereby be kept low, namely that expense which is exerted for the adaptation of the interrogation events and their frequency per inquiry location to the fluctuations and to the discontinuous changes of the volume of information to be interrogated.

The above object is achieved, according to the present invention, in that, after a reading of an address of an inquiry location from a memory location which is reached first, and given failure of an information respectively expected from this inquiry location to arrive after a selection of the inquiry location with this address, that next, further memory location at which the same address is stored is sought in the memory on the basis of the appertaining address. A note bit is stored here in assignment to this address. Subsequently thereto, the memory location following immediately upon the memory location reached first is sought for the continuation of the successively-following reading of the stored addresses. Given the presence of a note bit stored at a memory location, a selection of the appertaining inquiry location which is selectable by way of this address is suppressed, and the note bit is thereby, in turn, erased.

BRIEF DESCRIPTION OF THE DRAWING

Other objects, features and advantages of the invention, its organization, construction and operation will be best understood from the following detailed description, taken in conjunction with the accompanying drawing, on which there is a single figure which is a schematic representation of an exemplary embodiment of the invention showing the invention only in terms of those component parts which significantly contribute to an understanding of the invention.

DESCRIPTION OF THE PREFERRED EMBODIMENTS

The exemplary embodiment shown on the drawing illustrates portions of a circuit arrangement of telephone switching technology which is presumed to be known in terms of its many construction possibilities. In the present case, it will be assumed that the structure constitutes a telephone switching system in which all of the control events, for example connection set-up events, are centrally and/or subcentrally controlled. It is assumed that a central or subcentral information-processing sequential logic system P serves for the execution of this control. Of course, it has a limited call-handling capacity with respect to the information-processing capacity.

Connection-associated switching devices are present in great numbers in telephone switching systems. These connection-associated switching devices can be subscriber line circuits, selection receiving sets, connector sets, line terminating circuits of local lines and long-distance trunks and the like. In case the telephone switching system is constructed in pulse code modulation (PCM) technology, it would be assumed that the connection-associated switching devices are ports in the connecting groups. Detailed relationships regarding this structure are set forth in the description of the digital switching system EWSD in the supplement to the periodical "telcom report", 1981.

Information which are to be processed arrive into the connection-associated switching devices. This information is all switch identifiers which are output from some subscriber station from which subscribers intend to establish connections. The analogous case applies for connection-associated switching devices which are not subscriber-associated, for example connector sets, line terminating circuits and the like.

All information arriving into the connection-associated switching devices are to be processed at a central or subcentral location. These information are continuously interrogated in a known manner with the assistance of scan events, i.e. are called in from the connection-associated switching devices by way of information interrogating devices. Instead of connection-associated switching devices, inquiry locations, in the more general sense, shall therefore be predominantly mentioned below.

Inquiry locations A1, A2...An are shown in the upper portion of the drawing. Shown therebelow are portions of a switching matrix K, an information interrogating device L, to which the switching matrix likewise belongs, and a central processor P. In this context, reference is taken to the German published application No. 3,128,365, fully incorporated herein by this reference, which discloses an application for the circuit arrangement of the present invention. In this case, the inquiry locations would be buffers; the information interrogating device would be an input-output device. The known arrangement can be constructed in the manner of the present invention. Moreover, a corresponding digital switching system is set forth in the aforementioned periodical "telcom report".

The information interrogating device L, shown by way of excerpt on the drawing, controls the plurality of inquiry locations A1-An in regular fashion with the assistance of the switching matrix K assigned thereto, the switching matrix K comprising matrix switching devices k1-kn per respective inquiry location. The control of the switching matrix K by the information-interrogating device L occurs via a control path k in a manner which is likewise well known in the art. The selection can likewise occur with the assistance of addresses, in a known manner, these addresses being transmitted via an address multiple to the inquiry locations in which appropriate connecting devices then connect the respective inquiry location to a common data bus. In this case, the matrix switching devices k1-kn would be accommodated in the inquiry locations A1-An. It is also possible to accomplish the selection of the inquiry locations by way of the information-interrogating device L via a common data bus in accordance with time-division multiplex techniques, which are also well known in the art.

The information interrogating device L therefore drives the inquiry locations A1-An for the call in of information which may be present at the inquiry locations, driving the inquiry locations regularly in succession. This drive occurs with different interrogation frequency with respect to the various inquiry locations. This is accomplished in that some of the inquiry locations are each selected only once in every interrogation cycle, other inquiry locations are selected twice, others are selected three times, etc, whereby the interrogation with respect to the various interrogation locations therefore occurs with different frequencies. As shall yet be set forth in greater detail below, the information-interrogating device L is also capable of respectively changing the interrogation frequency with respect to each of the inquiry locations dependent on the appearance of information to be called in. The appertaining interrogation cycle is consequently shortened chronologically overall to the same degree to which inquiry locations are respectively not selected in an interrogation cycle.

The information-interrogating device L accomplishes the selection events via the control path k. This is executed with the assistance of a drive device E of the information-interrogating device L. The drive device E contains an interrogation memory composed of memory locations y1-yn. A respective address serving for the selection of respectively one of the inquiry locations A1-An is stored at each memory location. The appertaining address of each of these switching devices (inquiry locations) is stored at least respectively once, namely only once for some of the locations, twice for some of the locations, i.e. once at each of two different memory locations, three times for some of the locations, i.e. at three different memory locations in corresponding fashion, etc, up to a maximum of, for example, eight times at eight different memory locations. The selection or drive device E controls the inquiry locations A1-An in that it successively searches the memory locations y1-yz in successive cyclical sequence (it is thereby a matter of an overall selection cycle in the sense initially set forth) and individually reads the addresses of the inquiry locations stored therein in succession and successively transmits the addresses obtained to the switching matrix K in a successive manner. Here, they individually effect the connection of the respective inquiry locations to the processor P in succession, the processor P interrogating the inquiry location respectively selected in this manner as to the existence of an information which can be called in, interrogating the locations with the assistance of a call-in device Ab. When the call-in device Ab receives an information via a data path b and via the information-interrogating device L, it then stores the information in a list memory R of the processor P in a known manner with the assistance of a write device r, the processor P, in turn, calling the information in gradually from here for processing.

The various inquiry locations are therefore interrogated with different interrogation frequencies, the plurality of storages of the addresses of each of the inquiry locations serving this purpose. When an address of an inquiry location is repeatedly stored in the interrogation memory in this manner, then these storages are uniformly distributed in the sequence of the memory location y1-yn such that the appertaining inquiry location is successively selected in roughly identical time intervals. The individual number of selection events per inquiry location is therefore stored in the interrogation memory composed of the memory location y1-yn, being stored therein by the number of storages of their respective address.

The frequency of interrogation, which is the equivalent to the interrogation frequency for the memory location, is not defined only by the described plurality of storages per inquiry location, but is also changed on a case basis by the information-interrogating device L dependent on the appearance of an information to be called in. Whenever an inquiry location has not supplied any information when being interrogated by selection by way of its address, i.e. each time an information respectively expected from this inquiry location fails to appear after selection of the inquiry location with the respective address, that selection event which is provided as the next selection event is suppressed. When this is continuously repeated for an inquiry location, then the interrogation frequency for that inquiry location is thereby reduced to half.

In order to accomplish this, it is provided in accordance with the invention that, after a reading of an address of an inquiry location, for example the inquiry location A2, from a memory location which is reached first, for example y2, and given failure of an information relatively expected from this inquiry location to appear after selection of the inquiry location with this address, that next, further memory location, for example, the memory location yp, at which the same address, i.e. for example, in the address of the inquiry location A2, is stored, is sought in the memory on the basis of the appertaining address, in that a note bit in assignment to this address is stored at a memory location, for example the memory location xp, belonging to this memory location and in that, subsequently, the memory location, for example y3, immediately following the memory location reached first, for example the memory location y2, is sought for the continuation of the successively-occurring reading of the stored addresses. When a note bit is already stored at a memory location, for example the memory location xp, belonging to this one memory location, for example the location yp, then a selection of the appertaining inquiry location (for example Ap, not shown on the drawing) which would be selectable per se with address stored at the memory location yp is suppressed, whereby the note bit is then erased.

When in the course of the cyclical reading of the addresses of the inquiry locations the selection device E therefore reaches a memory location, for example the memory location y2, having a storage location, for example the storage location x2, at which a note bit is stored, then it erases the note bit at this storage location and simultaneously throws out the appertaining address on the basis of the stored note bit, i.e. the address of the appertaining inquiry location, for example the inquiry location A2, in that, after a preceding reading from the memory location, it in turn erases this address (without, however, this address being erased at the appertaining memory location itself), or in that it does not read this address at all. As a result thereof, a selection of the corresponding inquiry location, for example the inquiry location A2, with the appertaining address is suppressed and the selection device E is stepped to the next memory location, for example the memory location y3.

When, after the reading of an address of an inquiry location, for example the inquiry location A2, the same is selected in the described manner, but information is not received therefrom, then the storage of a note bit at a corresponding, later memory location is carried out. For this purpose, the selection device selects that next memory location, for example the memory location yp, at which it finds the same address stored, carrying out this search with the assistance of the previously-read address. Furthermore, the selection device E stores the note bit at the storage location, for example the storage location xp, belonging to this memory location, for example the memory location yp. The selection device then seeks out the memory location, for example the memory location y3, which follows immediately after the memory location, for example the memory location y2, which was selected first. This, as shall be set forth in greater detail below, can occur in three different ways.

In accordance with a first alternative, in the search run from the memory location y2 selected first to that further memory location at which the same address is stored, for example the memory location yp, the selection device counts the number of steps, with the assistance of a counter $z_1$–$z_n$ and, after storage of the note bit at the appertaining storage location, for example the location xp, is in turn returned by a plurality of steps (plurality of memory locations) which is lower by one. This number identified by the step counting can thereby be subsequently deincremented by one; or, when the further memory location yp is reached, the same address being stored there, the count value reached when the memory location, for example the memory location $y(p-1)$ lying immediately before that is reached is employed.

In accordance with a second, similar alternative, the selection device counts the number of steps in the same manner with the counter $z_1$–$z_n$ which is expanded to form a counting and subtraction device, but then subtracts this number from the total number of n memory locations increased by one, and, after the storage of the note bit carried out in the manner set forth above, is stepped forward by the number of steps (number of memory locations) corresponding to this difference, i.e. continuing cyclically forward beyond the last memory location yn and the first memory location y1 to the appertaining memory location, for example the location y3. In both instances the selection device ultimately arrives at the memory location, for example the memory location y3, which follows upon the memory location, for example the memory location y2, originally selected.

According to a third alternative, the selection device E is switched to a backward search run after its search run from the memory location, for example the memory location y2, selected first to the further memory location yp, where, therefore, the same address can be assumed to be stored, and after storage of the note bit at the storage location, for example the storage location xp, belonging thereto, this backward search run in the case of this third alternative, however, being executed with the assistance of the same, originally read address which has been intermediately stored in the selection device until the selection device has again reached the memory location y2 which was originally selected, this address, of course, being stored there. Subsequently, the selection device E is again stepped forward by one step, i.e. to the memory location y3 which follows immediately after the memory location y2 which was originally selected.

When, therefore, an address is read from a memory location, then a simultaneous check is carried out to see whether a note bit is already stored at the storage location assigned thereto, for example the storage location x2, with respect to the memory location y2. Given the presence of a note bit, a selection of the appertaining inquiry location, for example the inquiry location A2, selectable by this address is suppressed and the note bit stored is, in turn, erased. When, by contrast, an information respectively expected fails to appear after the selection of an inquiry location, the note bit is stored in assignment to the appertaining address in the manner set forth above.

The operation set forth above are accomplished by the selection device E. Whenever, therefore, it has again read an address of an inquiry location from the memory locations, for example the memory location y2, it then checks whether the note bit is stored at the storage location x2 assigned thereto. When this is the case, the selection device erases the note bit in the memory location x2; further, it also erases the previously-read address of the inquiry location, for example the inquiry location A2, in itself, after it has therefore read the same (but does not erase this address in the memory location y2) and forwards the cyclical read operation by one memory location, for example to the memory location y3, whereby the selection of an inquiry location for example the location a2, prepared with the last address is suppressed once because no information had been received in the appertaining, earlier selection of this same inquiry location, i.e. during the preceding selection cycle.

The present invention is also of significance for that application wherein the inquiry locations A1-An are connection-associated switching devices, but is also of significance when these inquiry locations are message buffers of subcontrollers of connecting groups (cf. the descriptions in the aforementioned periodical "telcom report"). In such an application, the inquiry locations therefore comprise, among other things, memories for an entire respective plurality of information which are to be successively fetched. As a result of the present invention, the interrogation events can be differently concentrated on these message buffers on a case basis and, as needed, based on the measure of the respective volume of information which are ready to be called in in each of the message buffers and are to be supplied to the processor P for processing.

Although I have described my invention by reference to particular illustrative embodiments and alternatives thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for a telecommunications system, comprising:
   a plurality of inquiry locations at which information may be present and may be solicited, each of said inquiry locations assigned an address;
   a cyclically operating interrogation device for selective connection to and driving said inquiry locations to solicit information and to modify the frequency of interrogation of the individual inquiry locations depending on the appearance of solicited information to be called in; and
   memory means including an interrogation memory comprising a sequence of memory locations with corresponding note bit locations for storing a plurality of selection events within an overall control cycle by storing individual addresses of said inquiry locations a plurality of times at a corresponding number of memory locations regularly distributed within the sequence of memory locations, interrogation memory selection means for reading the stored addresses to cyclically access said inquiry locations for soliciting information and upon failure to receive information from an accessed inquiry location to read the same address from the next memory location for access and store a note bit in the corresponding note bit location and to resume reading at the memory location in the sequence following that corresponding to the first read address, and means for suppressing reading of an address in response to the appearance of a note bit for that address and then erasing the note bit.

2. The circuit arrangement of claim 1, and further comprising:
   means for operating said interrogation memory selection means backwards, after a note bit has been stored, to search for the same address and, upon reaching the same address, to step forward one memory location to the next address to resume forward cyclical reading.

3. The circuit arrangement of claim 1, and further comprising:
   means operable, in a forward search run, to count and store the number of memory locations from a first read address to the next stored same address and to run the interrogation memory selection means in the reverse direction the same number of locations minus one to resume forward cyclical reading.

4. The circuit arrangement of claim 1, and further comprising:
   means operable, in a forward search run, to count and store the number of memory locations from a first read address to the next stored same address, forming the difference between the total number of memory locations and the count, and then advancing the information memory selection device forward by that difference plus one to resume forward cyclic reading.

* * * * *